United States Patent
Wiesinger et al.

(10) Patent No.: US 7,847,545 B2
(45) Date of Patent: Dec. 7, 2010

(54) SYSTEM AND METHOD FOR CORRECTING FLOW VELOCITY MEASUREMENTS IN PHASE CONTRAST IMAGING USING MAGNETIC FIELD MONITORING

(75) Inventors: Florian Wiesinger, Garching (DE); Thomas K. F. Foo, Clifton Park, NY (US); Mika Vogel, Garching b. Munchen (DE); Dirk Lange, Garching b. Munchen (DE)

(73) Assignee: General Electric Company, Niskayuna, NY (US)

( * ) Notice: Subject to any disclaimer, the term of this patent is extended or adjusted under 35 U.S.C. 154(b) by 297 days.

(21) Appl. No.: 12/101,279

(22) Filed: Apr. 11, 2008

(65) Prior Publication Data

US 2009/0256568 A1 Oct. 15, 2009

(51) Int. Cl.
*G01V 3/00* (2006.01)
(52) U.S. Cl. ...................... 324/306; 324/309
(58) Field of Classification Search .......... 324/306, 324/309
See application file for complete search history.

(56) References Cited

U.S. PATENT DOCUMENTS

| | | | |
|---|---|---|---|
| 3,510,832 A | 5/1970 | Golay | |
| 4,193,024 A | 3/1980 | Hoult et al. | |
| 4,417,209 A | 11/1983 | Hounsfield | |
| 4,623,843 A | 11/1986 | Macovski | |
| 4,698,591 A | 10/1987 | Glover et al. | |
| 4,870,361 A | 9/1989 | In Den Kleef et al. | |
| 5,289,127 A | 2/1994 | Doddrell et al. | |
| 5,488,950 A | 2/1996 | Ehnholm | |
| 5,731,704 A | 3/1998 | Schnur et al. | |
| 5,770,943 A | 6/1998 | Zhou | |
| 5,942,897 A * | 8/1999 | Kanazawa | 324/309 |
| 6,442,414 B1 * | 8/2002 | Watanabe | 600/419 |
| 7,208,951 B2 | 4/2007 | Pruessmann et al. | |

FOREIGN PATENT DOCUMENTS

| | | | |
|---|---|---|---|
| EP | 0337588 A2 | 10/1989 | |
| EP | 1178327 A2 | 2/2002 | |
| EP | 1209480 A2 | 5/2002 | |
| EP | 1582886 A1 | 10/2005 | |

OTHER PUBLICATIONS

Barmet et al., "Field monitoring with NMR probes for non-Cartesian MRI".

(Continued)

*Primary Examiner*—Louis M Arana
(74) *Attorney, Agent, or Firm*—Jason K. Klindtworth

(57) ABSTRACT

A system and method of phase contrast imaging includes a system control programmed to acquire a first set of data and a second set of data via the RF coil assembly during a scan and acquire a third set of data and a fourth set of data via the plurality of magnetic field monitoring devices during the scan. A first single data set from the first and third sets of data is formed, and a second single data set from the second and fourth sets of data is formed. The system control is also programmed to reconstruct a phase contrast image based on the first and second single data sets to correct for spatially-dependent background phase variations.

21 Claims, 6 Drawing Sheets

OTHER PUBLICATIONS

De Zanche et al., "NMR probes for magnetic field monitoring during MRI," Proc. Intl. Soc. Mag. Reson. Med., 2005, vol. 13, p. 791.

De Zanche et al., "Advances in NMR Probe Technology for Magnetic Field Monitoring," Proc. Intl. Soc. Mag. Reson. Med., 2006, vol. 14, p. 781.

De Zanche et al., "Tranceive Field Probes for Magnetic Field Monitoring at 7T," Proc. Intl. Soc. Mag. Reson. Med., 2007, vol. 15, p. 3261.

Mason et al., "A Method to Measure Arbitrary k-Space Trajectories for Rapid MR Imaging," Williams & Wilkins, 1997, pp. 492-496.

Brau et al., "Self-Navigated Motion Detection Technique Generalized for Arbitrary Pulse Sequences," Proc. Intl. Soc. Mag. Reson. Med., 2005, vol. 13, p. 508.

Zhu, "Parallel Excitation With an Array of Transmit Coils," Magnetic Resonance in Medicine, 2004, vol. 51, pp. 775-784.

Pruessmann et al., "Magnetic Field Monitoring during MRI Acquisition Improves Image Reconstruction," Proc. Intl. Soc. Mag. Reson. Med., 2005, vol. 13, p. 681.

Bernstein et al., "Concomitant Gradient Terms in Phase Contrast MR: Analysis and Correction," MRM, 1998, vol. 39, pp. 300-308.

Hennig, "Chemical Shift Imaging with Phase-Encoding RF Pulses," Magnetic Resonance In Medicine, 1992, vol. 25, pp. 289-298.

Jehenson et al., "Analytical Method for the Compensation of Eddy-Current Effects Induced by Pulsed Magnetic Field Gradients in NMR Systems," Journal of Magnetic Resonance, 1990, vol. 90, pp. 264-278.

Walker et al., "Semiautomated Method for Noise Reduction and Background Phase Error Correction in MR Phase Velocity Data," JMRI, May/Jun. 1993, vol. 3, No. 3, pp. 521-530.

Bernstein et al., Handbook Of MRI Pulse Sequences, 2004, pp. 316-331 and pp. 274-291.

\* cited by examiner

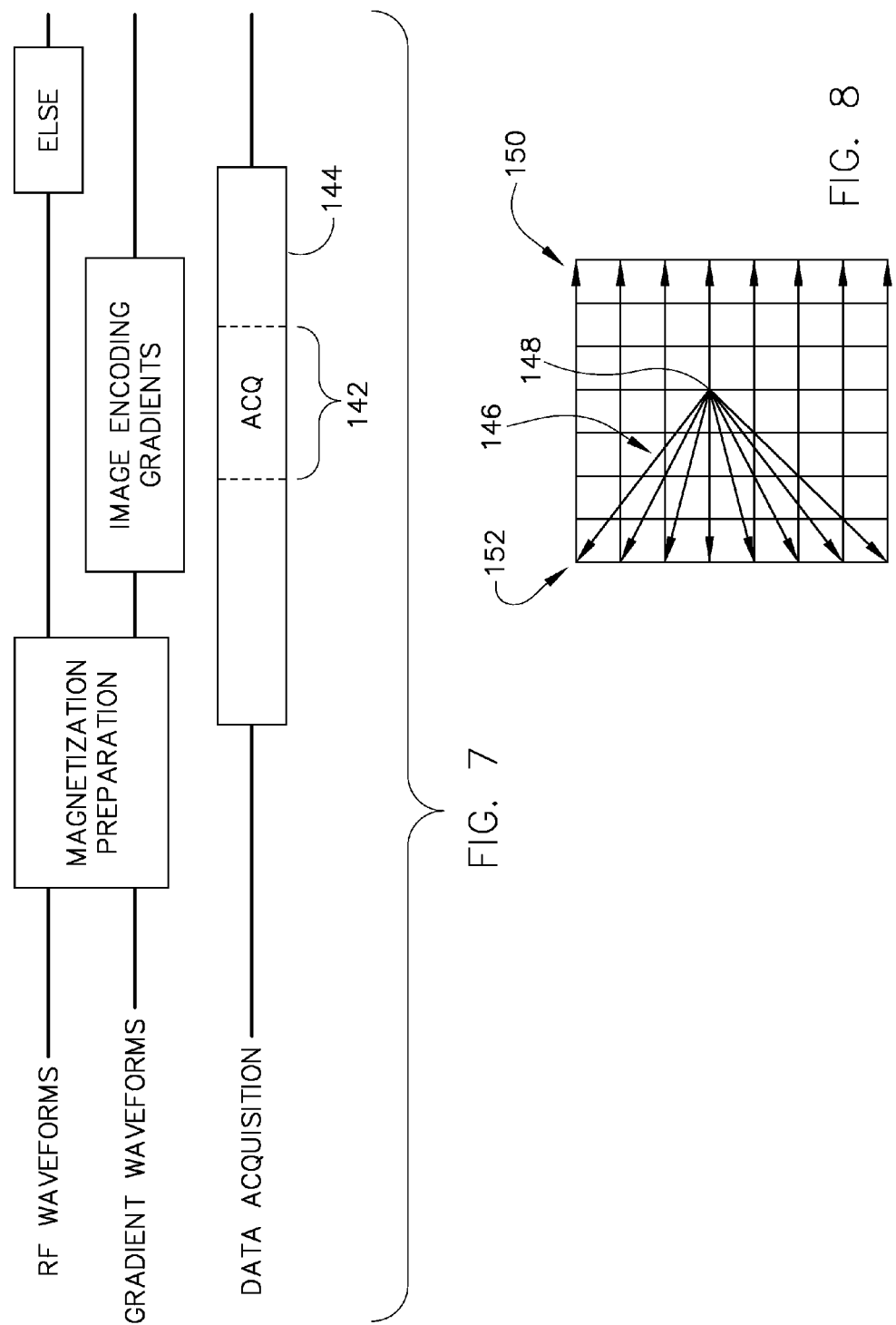

SYSTEM AND METHOD FOR CORRECTING FLOW VELOCITY MEASUREMENTS IN PHASE CONTRAST IMAGING USING MAGNETIC FIELD MONITORING

BACKGROUND OF THE INVENTION

The present invention relates generally to MR imaging and, more particularly, to a system and method for correcting flow velocity measurements in phase contrast imaging using magnetic field monitoring.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Phase contrast measurement imaging is based on phase shifts accumulated by spins moving through magnetic field gradients. To account for field and susceptibility variations across the subject, two measurements with different velocity sensitivities are usually obtained. Ideally, phase subtraction of the two measurements cancels out any phase resulting from time-invariant magnetic field inhomogeneities such as susceptibility effects and phase contributions of stationary spins. Accordingly, the phase difference observed is expected to be linearly related to velocities in the object. In practice, however, residual phase errors result in a spatially-varying phase across the phase-difference image. Such phase errors may be induced by gradient switching, which causes eddy-current induced phase errors, and by phase errors related to magnetic fields concomitant to the actual gradient fields used for velocity encoding, also known as concomitant field induced phase errors.

Since any non-zero phase in the phase difference (or phase velocity) image corresponds to motion, accurate absolute measurements of velocity and flow are very difficult without effective baseline correction. One technique for baseline correction is performed by measuring the phase in an adjacent stationary structure and subtracting that mean baseline value from that in the primary vessel of interest. However, this type of correction is not possible if there are no adjacent stationary structures (such as in the heart) or when the background phase has substantial spatial variation.

Another technique is to perform a background phase correction to the image by fitting a linear, quadratic, or higher order spatial function to the image and using the fitted data to correct for the background variation in phase. This approach may include errors if there is a lack of appreciable stationary structures in the image. Furthermore, the spatial extent of the stationary structures may be limited, which adversely affects the precision of the fit. In addition, spatially-varying background phase may also be time-varying as a result of eddy current effects, which impacts the overall background phase in a phase difference or complex difference processed velocity image.

Gradient switching may induce eddy currents in the metallic structures of the scanner. Magnetic field distortions typically result if eddy currents are not fully blocked or if pre-emphasis currents are not properly adjusted. The eddy-current field opposes the initial gradient field and thereby decreases the desired rate of change. These effects increase with increasing gradient performance.

The time-dependent magnetic field can be decomposed into different orders of spatial variation:

$$B_o(\vec{r}, t) = B_o(t) + x\frac{dB_o(t)}{dx} + y\frac{dB_o(t)}{dy} + \quad \text{(Eqn 1)}$$

$$z\frac{dB_o(t)}{dz} + \frac{1}{2}\left(x^2\frac{d^2B_o(t)}{dx^2} + y^2\frac{d^2B_o(t)}{dy^2} + z^2\frac{d^2B_o(t)}{dz^2} + \right.$$

$$\left. xy\frac{d^2B_o(t)}{dxdy} + xz\frac{d^2B_o(t)}{dxdz} + yz\frac{d^2B_o(t)}{dydz} + \ldots \right.$$

where $B_o(t)$ denotes the time-dependent, spatially-constant field;

$$\frac{dB_o(t)}{dx},$$

$$\frac{dB_o(t)}{dy},$$

$$\frac{dB_o(t)}{dz}$$

denotes the time-dependent, spatially linear gradient fields; and $$\frac{d^2B_o(t)}{dx^2},$$

$$\frac{d^2B_o(t)}{dy^2},$$

$$\frac{d^2B_o(t)}{dz^2},$$

$$\frac{d^2B_o(t)}{dxdy},$$

$$\frac{d^2B_o(t)}{dxdz},$$

$$\frac{d^2B_o(t)}{dydz}$$

denotes the time-dependent, spatially quadratic (second order) fields.

In general, the eddy-current field patterns are complex in space and time. In most practical situations, however, it is sufficient to consider $0^{th}$ and $1^{st}$ order spatial terms only. The eddy-current induced field of $0^{th}$ order corresponds to a residual static field ($B_o$) offset and results in a phase error that is constant across the image. The field of $1^{st}$ order affects the gradient fields and can roughly be described in a delay in the net gradient waveform, corresponding to a linear phase ramp in image space according to the Fourier shift theorem.

One approach for eddy-current compensation includes modeling phase errors based on system specific parameters, which then leads to gradient waveform compensation based on the system specific parameters. Another approach is applied during image reconstruction. Image-based corrections are usually based on the determination of the phase of static tissue and subsequent subtraction of this residual phase or a model fitted to the residual phase from the actual data. Static tissue may be identified automatically by using magnitude-based criteria or, if time-resolved data are available, based on the variance of the image phase over time.

It would therefore be desirable to have a system and method capable of minimizing or correcting flow velocity measurements in phase contrast imaging independent of the specific source of magnetic field encoding errors.

BRIEF DESCRIPTION OF THE INVENTION

The present invention provides a system and method of phase contrast imaging that overcome the aforementioned drawbacks.

In accordance with another aspect of the invention, an MRI apparatus includes a plurality of gradient coils positioned around a bore of a magnet and an RF coil assembly coupled to a pulse generator to emit RF pulse sequences and arranged to receive resulting MR signals from a subject of interest. A plurality of magnetic field monitoring devices positioned within the bore are included as well as a system control coupled to the plurality of gradient coils, the RF coil assembly, and the plurality of magnetic field monitoring devices. The system control is programmed to acquire a first set of data and a second set of data via the RF coil assembly during a scan and acquire a third set of data and a fourth set of data via the plurality of magnetic field monitoring devices during the scan. A first single data set from the first and third sets of data is formed, and a second single data set from the second and fourth sets of data is formed. The system control is also programmed to reconstruct a phase contrast image based on the first and second single data sets to correct for spatially-dependent background phase variations.

In accordance with another aspect of the invention, a method of MR imaging includes exciting a plurality of spins in an imaging subject to emit a first signal, acquiring a first set of MR data from the first signal via an RF coil assembly, and acquiring a first set of magnetic field data via a plurality of magnetic field monitoring devices. The method also includes exciting a plurality of spins in an imaging subject to emit a second signal, acquiring a second set of MR data from the second signal via the RF coil assembly, and acquiring a second set of magnetic field data via the plurality of magnetic field monitoring devices. The first set of MR data is corrected for time-dependent main magnetic field offset using the first set of magnetic field data, and the second set of MR data is corrected for time-dependent main magnetic field offset using the second set of magnetic field data. Further, the method includes generating a phase contrast image based on the first and second corrected sets of MR data.

In accordance with another aspect of the invention, the invention is embodied in a computer program stored on a computer readable storage medium and having instructions, which, when executed by a computer, cause the computer to execute a pair of scan sequences having a respective flow-encoding gradient applied therein and, during execution of each scan sequence, acquire an MR data set via an RF coil assembly, acquire a measured k-space location data set via a magnetic field monitoring system, and acquire a main magnetic field offset data set via the magnetic field monitoring system, the measured k-space location data set and the main magnetic field offset data set correlated to each other and to the MR data set. The instructions further cause the computer to correct k-space trajectory perturbations for each MR data set using the measured k-space location data set correlated thereto and using the first main magnetic field offset data set correlated thereto and reconstruct a phase contrast image based on the corrected MR data sets.

Various other features and advantages of the present invention will be made apparent from the following detailed description and the drawings.

BRIEF DESCRIPTION OF THE DRAWINGS

The drawings illustrate embodiments presently contemplated for carrying out the invention.

In the drawings:

FIG. 7 is a schematic diagram of a pulse sequence according to an embodiment of the invention.

FIG. 8 is an illustration showing movements of acquisition locations according to an embodiment of the invention.

DETAILED DESCRIPTION OF THE PREFERRED EMBODIMENT

Figure 1:
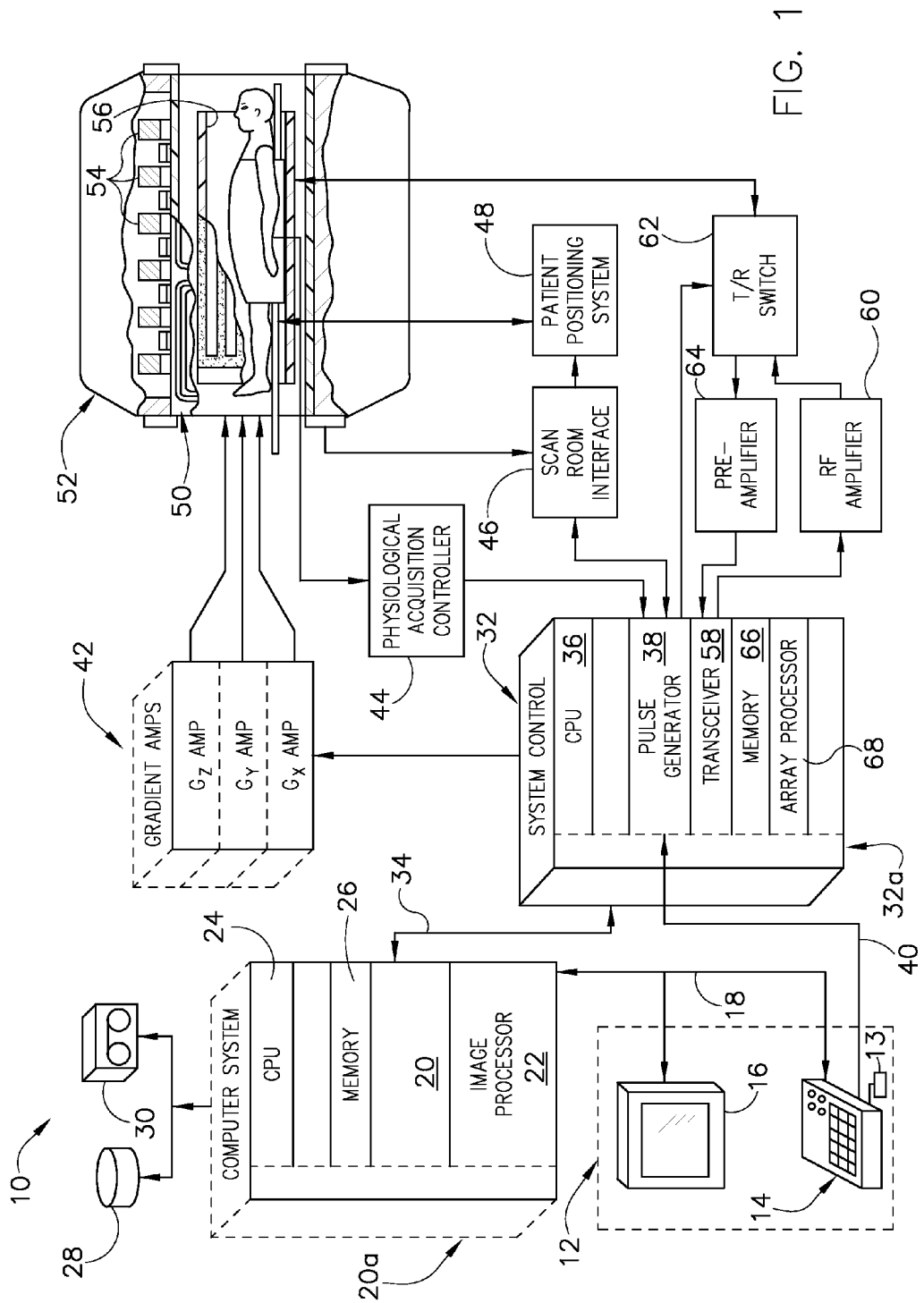
FIG. 1 is a schematic block diagram of an MR imaging system incorporating the present invention.

Referring to FIG. 1, the major components of an exemplary magnetic resonance imaging (MRI) system 10 incorporating embodiments of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back up memory or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient 45, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

According to embodiments of the invention, errors in a phase velocity image can be corrected using magnetic field monitoring. If a phase contrast experiment with two velocity encoding gradients of different polarity is considered in one embodiment, $$S_1(t) = \iint f(\vec{r}) \exp(-j(\vec{k}\cdot\vec{r} + \phi_v(\vec{r}) + \phi_e(\vec{r}) + \phi_s(\vec{r}))) dr \quad \text{(Eqn. 2)}$$

for the first flow encoding data set, and $$S_2(t) = \iint f(\vec{r}) \exp(-j(\vec{k}'\cdot\vec{r} + \phi'_v(\vec{r}) + \phi'_e(\vec{r}) + \phi_s(\vec{r}))) dr \quad \text{(Eqn. 3)}$$

where $\phi_v(\vec{r})$ represents the phase due to flowing spins or motion; $\phi_e(\vec{r})$ represents the spatially- or time-dependent phase due to gradient field imperfections, eddy currents, and concomitant gradients; and $\phi_s(\vec{r})$ represents the static phase variation in the image due to time-independent effects (echo centering, susceptibility, etc.). On taking the phase difference between Eqns. (2) and (3), a phase is yielded that has $$\Delta\phi(\vec{r}) = (\phi_v(\vec{r}) - \phi'_v(\vec{r})) + (\phi_e(\vec{r}) - \phi'_e(\vec{r})) \quad \text{(Eqn. 4)},$$

where typically, $$\phi'_v(\vec{r}) = -\phi_v(\vec{r}) \text{ and } \phi_v(\vec{r}) - \phi'_v(\vec{r}) = \frac{\pi v}{VENC}$$

give a direct measure of the velocity, v. VENC is the maximum velocity that can be encoded without aliasing and is a function of the gradient moment of the flow encoding gradient waveform. The presence of the eddy current term, $\phi_e(\vec{r}) - \phi'_e(\vec{r})$, leads to an error in the velocity measurements in the phase image.

In Eqns. (2) and (3), the phase error term has a spatial variation that is approximated by Eqn. (1). Hence, the placement of sensors in the bore of the magnet allows characterization of the spatial magnetic field variation. This is incorporated as a $B_0$ and k-space trajectory variation that, when accounted for in the image reconstruction, results in a phase difference image, which is free of the phase error term. As the phase due to velocity is specific to only the location of flowing spins, it is not reflected as a perturbation of k-space and, as such, is not measurable with the gradient sensors. That is, Eqns. (2) and (3) may be considered as $$S_1(t) = \iint f(\vec{r}) \exp(-j(\vec{k}'\cdot\vec{r} + \phi_v(\vec{r}) + \phi_s(\vec{r}))) dr \quad \text{(Eqn. 5)}$$

and $$S_2(t) = \iint f(\vec{r}) \exp(-j(\vec{k}''\cdot\vec{r} + \phi'_v(\vec{r}) + \phi_s(\vec{r}))) dr \quad \text{(Eqn. 6)}.$$

By reconstructing the individual flow encoding images separately, each with its own and different k-space trajectories (as determined from the gradient monitoring measurements), the phase error term due to eddy currents and concomitant gradient fields can be eliminated. After correcting for the phase error terms by correcting the k-space trajectories for each flow encoding gradient, the data can be processed in the conventional manner to yield a phase difference (phase-velocity) image that is free of eddy current or concomitant gradient effects.

The following nomenclature may be used herein below:

b . . . index for gradient polarity of phase contrast imaging;

c . . . index for RF receiver coil element;

$\{t_a\}$ . . . measurement time points $\{t_n\}$;

$S'_{b,c}(\{t_a\})$ . . . samples acquired with the $b_{th}$ gradient polarity of the phase contrast imaging sequence at time points $\{t_a\}$ obtained from the receiver coil element b;

$S_{b,c}(\{t_a\})$ . . . samples acquired with the $b_{th}$ gradient polarity of the phase contrast imaging sequence at time points $\{t_a\}$ obtained from the receiver coil element b, including correction for time dependent main magnetic field offset;

$k_b(\{t_a\})$ . . . measured k-space locations for the $b_{th}$ gradient polarity of the phase contrast imaging sequence at times points $\{t_a\}$ obtained from the field monitoring device;

$B_{0,b}(\{t_a\})$ . . . main magnetic field offset for the $b_{th}$ gradient polarity of the phase contrast imaging sequence at times points $\{t_a\}$ obtained from the field monitoring device.

Figure 2:
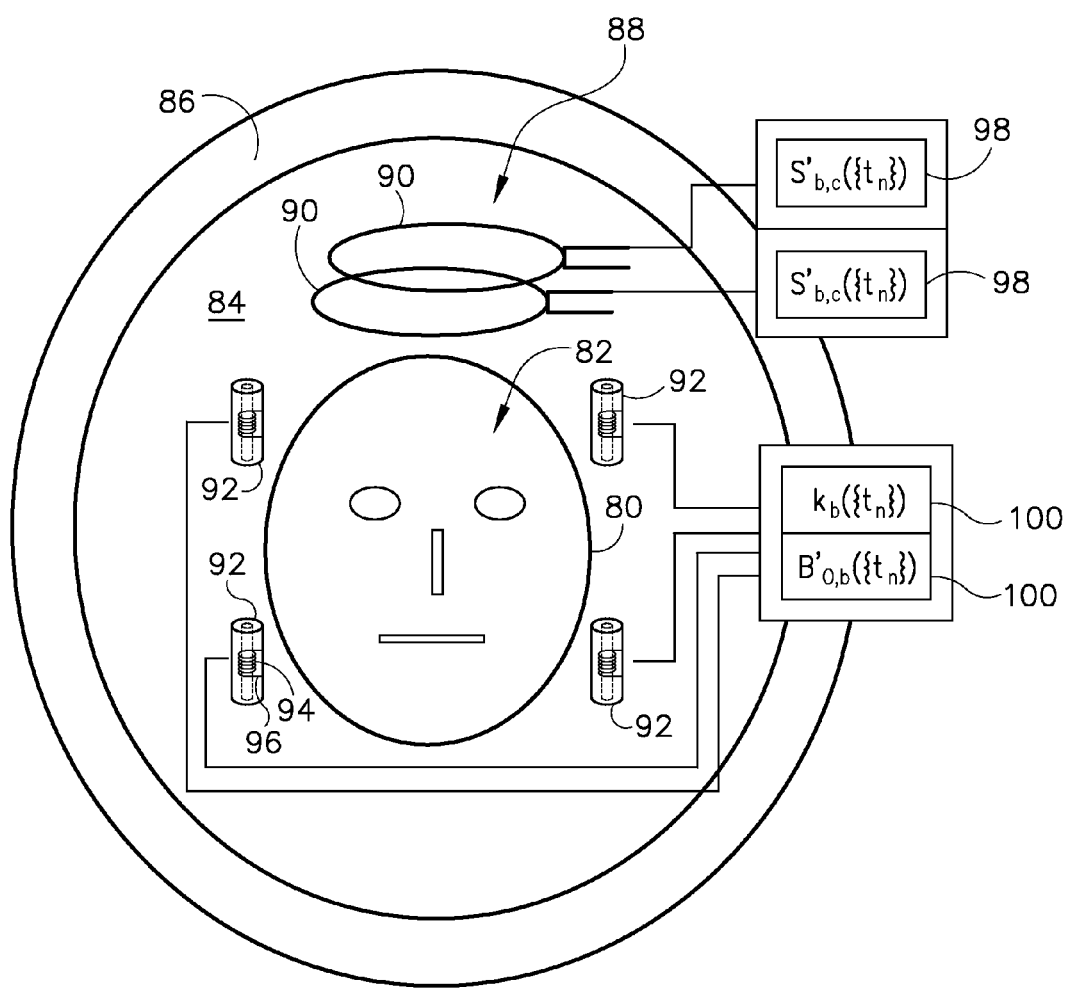
FIG. 2 is a schematic diagram of an MR imaging or measurement setup according to an embodiment of the invention.

Referring to FIG. 2, a schematic diagram of an MR imaging or measurement setup is shown. A subject 80, such as a patient 45 (FIG. 1), is positioned within a bore 84 of a magnet assembly 86, such as magnet assembly 52 (see FIG. 1), and has a region-of-interest 82 of which a phase contrast image is desired. An RF receiver coil assembly 88 is positioned such that, as described above, signals emitted by excited nuclei in the region-of-interest 82 may be sensed. RF receiver coil assembly 88 may comprise a single RF receiver coil 90 or a plurality of RF receiver coils 90. Accordingly, embodiments of the invention are applicable to single- and multi-coil imaging.

A plurality of magnetic field monitoring probes or devices 92 are positioned around subject 80. When field monitoring devices 92 surround the region-of-interest 82 and measure magnetic field information at the locations of the devices or sensors 92, a linear model, such as Eqn. 1, may be used to describe the magnetic field within the region of interest. Accordingly four sensors 92 are used to solve for the four unknowns B0, dB0/dx, dB0/dy, dB0/dz. In addition, one skilled in the art would recognize that it is possible to determine the complete magnetic field inside the region-of-interest 82 via solving boundary value problems based on measured information from many sensors. Each device 92 contains a small quantity of an MR-active substance 94 and an MR coil 96. The size of the MR-active substance 94 may typically range from 0.2 to 2 mm in diameter.

As shown, four field monitoring devices 92 surround region-of-interest 82. However, it is contemplated that more than four devices 92 may be used (for example, eight devices 92) such that higher order spatial field inhomogeneities may be accounted for by using appropriate numbers of magnetic field sensors.

During a phase contrast imaging sequence scan, data sets 98 are acquired from RF receiver coil assembly 88, and data sets 100 are acquired from the plurality of magnetic field monitoring devices 92. As will be described, data sets 98, 100, when used according to embodiments of the invention, allow for correction of eddy-current induced encoding errors, which are a major source of inaccuracies in phase contrast MR imaging, and for correction of image encoding errors due to hardware imperfections, eddy currents, and concomitant field effects. Accordingly, embodiments of the invention result in improved phase contrast image quality as well as increased accuracy in the case of quantitative flow measurements without affecting the phase accumulation due to flow or motion.

Figure 3:
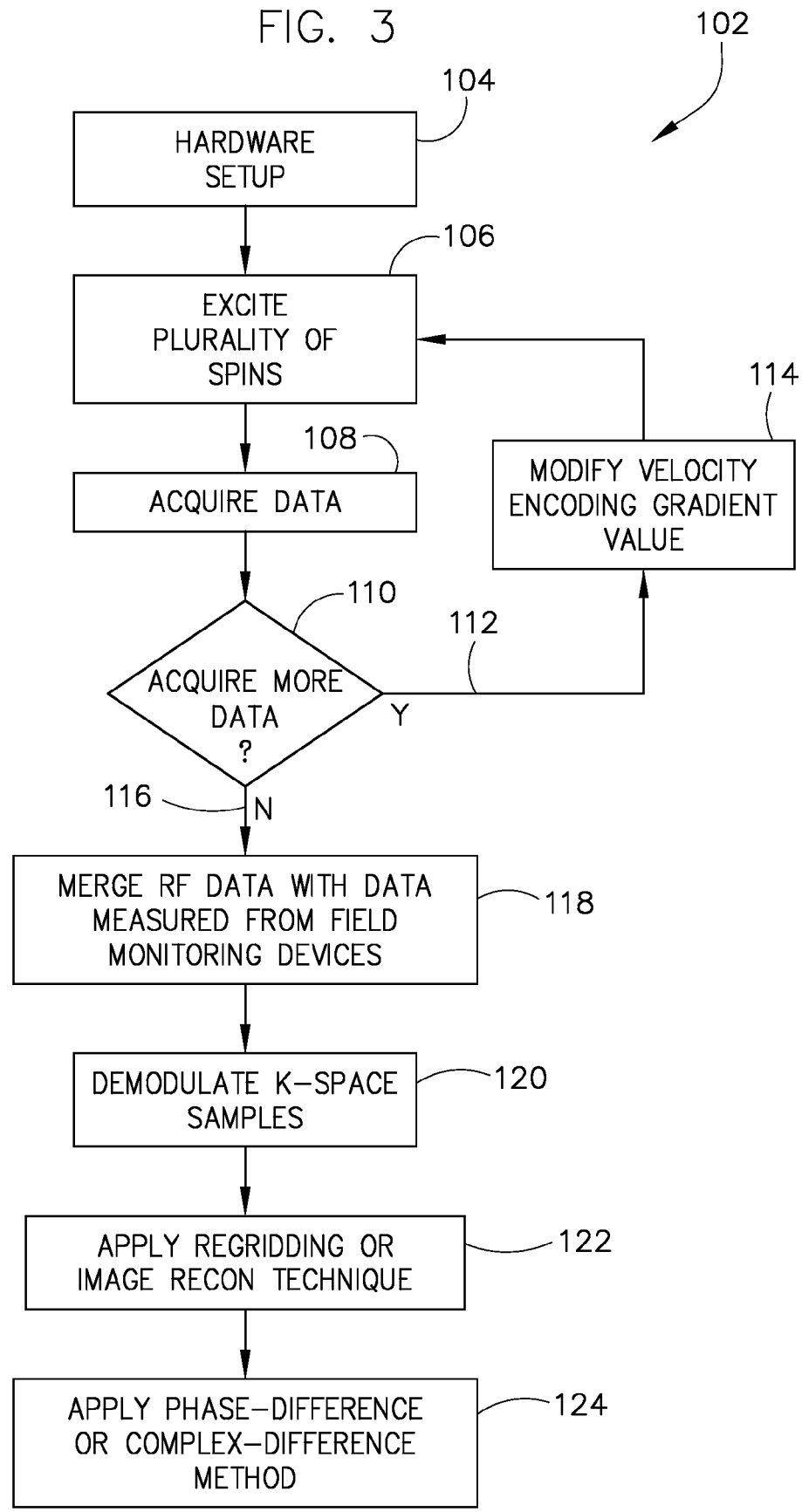
FIG. 3 is a flowchart of a technique for phase contrast imaging according to an embodiment of the invention.

FIG. 3 shows a flowchart of a technique for phase contrast imaging according to an embodiment of the invention. Technique 102 begins at STEP 104 with hardware setup. In this step, the magnetic field monitoring probes (at least four) are positioned adjacently to and around the subject so as to surround the subject. If surface RF receiver coils are used, they are also positioned appropriately in this step. Next, a plurality of spins in the subject are excited such that a signal is emitted from the region-of-interest at STEP 106. The plurality of spins are excited using a flow-encoding gradient having a first velocity encoding gradient value, such as a first polarity scheme. In a preferred embodiment, a bipolar gradient is used as the flow-encoding gradient.

Data from each of one or more RF coils is acquired as well as data from the magnetic field monitoring probes at STEP 108. The data from the RF coils and the data from the field monitoring probes are preferably simultaneously acquired. According to an embodiment of the invention, a data set $(S'_{b,c}(\{t_a\}))$ from each RF coil is acquired, and a pair of data sets from the magnetic field monitoring probes is acquired.

The pair of data sets includes a data set $(k_b(\{t_a\}))$ of measured k-space locations for the first velocity encoding gradient value and a data set $(B_{0,b}(\{t_a\}))$ of main magnetic field offsets for the first velocity encoding gradient value.

At STEP 110, technique 102 determines whether more data should be collected. If data sets for two different flow-encoding gradients have not been acquired 112, then at STEP 114, the velocity encoding gradient value is modified, such as to an opposite polarity, and STEPS 106-110 are again repeated as described above to acquire data sets corresponding to a second velocity encoding gradient value.

Once data sets for two different flow-encoding gradients have been acquired 116, the data set from each RF coil may be then corrected. Because the RF receiver coil data and field monitoring data are obtained simultaneously, the time points $\{t_a\}$ can be replaced in favor of the measured k-space locations $\{k_a\}$. In this way the three variables or data sets $S'_{b,c}(\{t_a\})$, $k_b(\{t_a\})$ and $B_{0,b}(\{t_a\})$ for each RF coil can be merged into two respective effective variables or data sets $S'_{b,c}(\{k_{b,a}\})$, and $B_{0,b}(\{k_{b,a}\})$ at STEP 118. At STEP 120, the time varying main magnetic field offset can be corrected by demodulation of each k-space sample $S'_{b,c}(\{k_{b,a}\})$ with the corresponding main magnetic field offset $B_{0,b}(\{k_{b,a}\})$. In this way, main magnetic field offset corrected k-space samples or data sets $S_{b,c}(\{k_{b,a}\})$ with exact knowledge of their k-space location $\{k_{b,a}\}$ are obtained.

Figure 4:
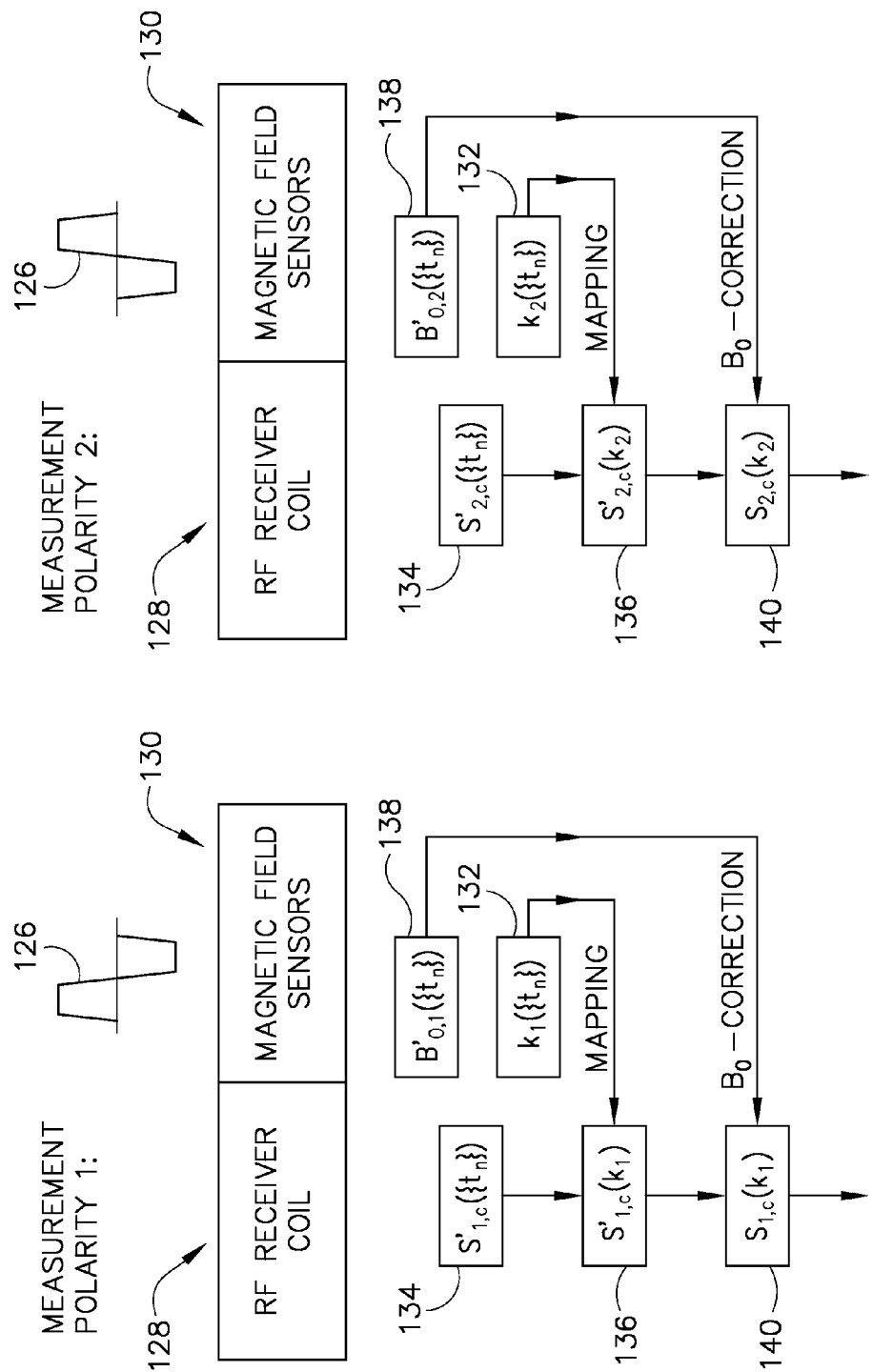
FIG. 4 is a schematic diagram of a correction to data sets acquired with gradient polarities according to an embodiment of the invention.

Referring now to FIG. 4, a schematic diagram of a correction to data sets acquired with gradient polarities is shown. For each respective polarity 126, RF receiver coil data 128 is corrected using magnetic field sensor data 130. In particular, a data set of measured k-space locations 132 is mapped to an RF data set 134, resulting in a modified RF data set 136. Then, modified RF data set 136 is $B_0$-corrected using a data set of main magnetic field offsets 138, resulting in an RF data set 140 that is corrected for time-dependent main magnetic field offset.

Figure 6:
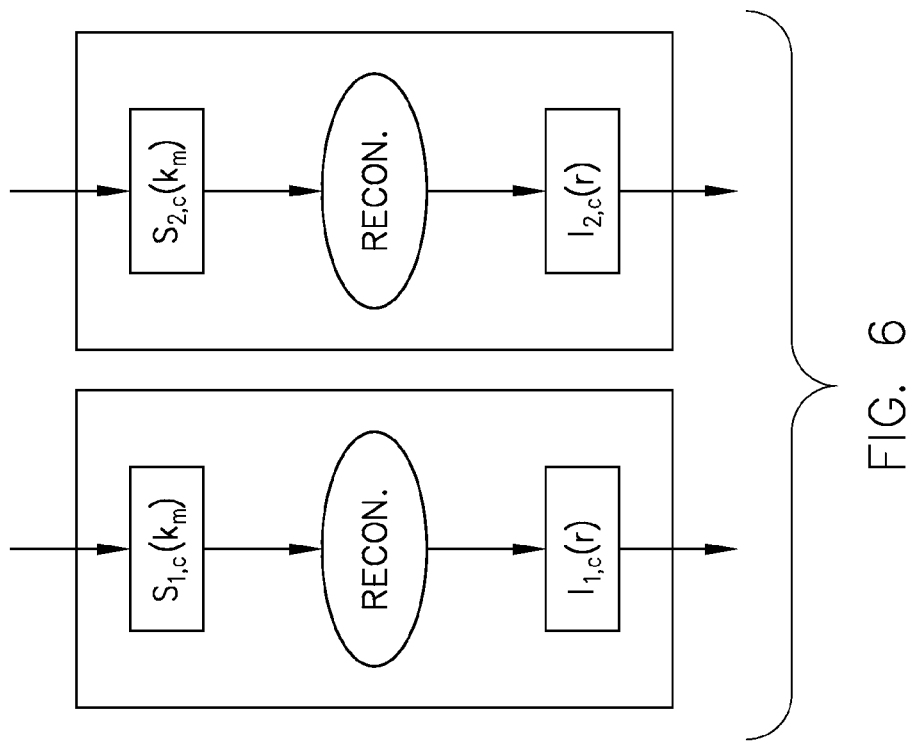
FIG. 6 is a flowchart of an image reconstruction technique according to an embodiment of the invention.
Figure 5:
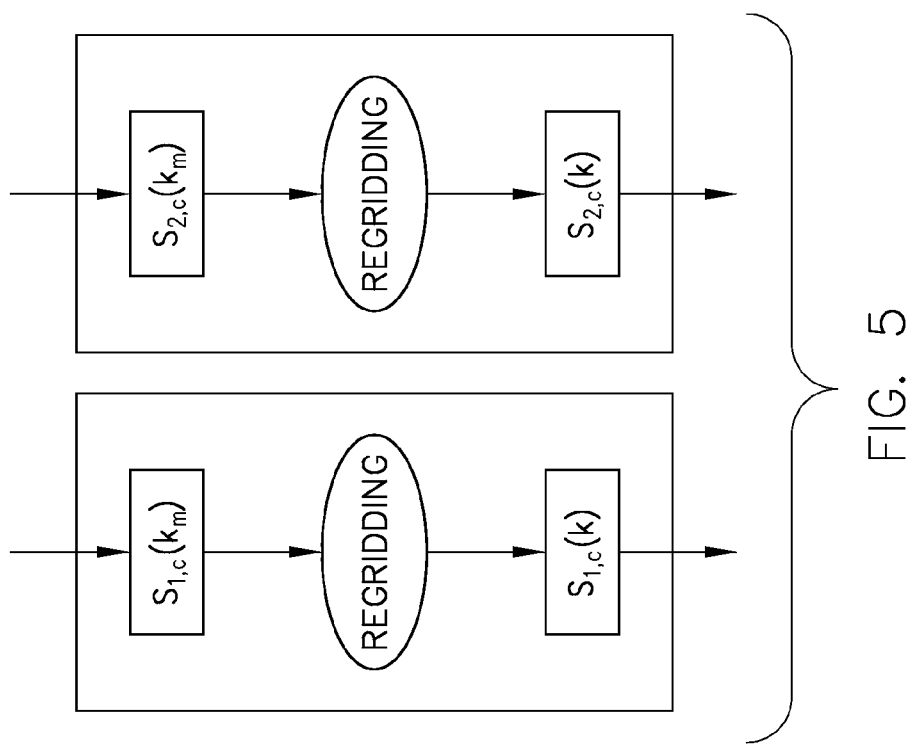
FIG. 5 is a flowchart of a regridding technique according to an embodiment of the invention.

Referring again to FIG. 3, after k-space samples $S_{b,c}(\{k_{b,a}\})$ have been constructed at STEP 120, the k-space samples $S_{b,c}(\{k_{b,a}\})$ be used to reconstruct a phase contrast image through either a regridding technique or an image reconstruction technique at STEP 122 followed by the application of either a phase-difference reconstruction method or a complex-difference reconstruction method at STEP 124. Through the regridding technique, as shown in FIG. 5, data in each k-space sample data set $S_{b,c}(k_m)$ may be resampled onto a uniform rectilinear grid, resulting in respective data sets $S_{b,c}(k)$. Alternatively, as shown in FIG. 6, data in each k-space sample data set $S_{b,c}(k_m)$ may be reconstructed to image-domain data sets $I_{b,c}(r)$. As described in FIG. 2, data sets $S_{b,c}(k_m)$ or data sets $I_{b,c}(r)$ may subsequently have either a phase-difference reconstruction method or a complex-difference reconstruction method applied thereto to generate a phase contrast (phase-velocity) image that is free of eddy-current or concomitant gradient effects. Phase-difference and complex-difference reconstruction methods known in the art may be used.

FIGS. 7 and 8 show extended k-space data acquisition according to an embodiment of the present invention. Monitoring gradient encoding allows extending the acquisition window in such a way that sampling can start directly after magnetization preparation is finished and continue until the next RF pulse is applied. FIG. 7 schematically shows a pulse sequence that is usable in embodiments of the invention as described above. A region 142 of data acquisition window 144 illustrates where MR data may typically be acquired. However, acquisition of magnetic field monitoring device data to other with acquisition of MR data from an RF coil allows using the full data acquisition window 144 during imaging. As shown in FIG. 8, in addition to acquiring k-space data to horizontally fill a k-space data set, RF data produced during an initial preparation phase 146 may also be acquired. For example, whenever gradients are used to move the acquisition location from the center 148 of k-space 150 to certain, initial k-space starting locations 152, acquisition of the RF signals transmitted during this initial k-space path can be used to improve image reconstruction. Hence, the additionally acquired data provides redundant information, which can be used to either increase SNR or to reduce motion artifacts. One skilled in the art would recognize that acquiring RF signals transmitted during movement of the acquisition location from the center 148 of k-space 150 to k-space starting locations 152 is applicable for all MR imaging and spectroscopy applications.

Advantages of embodiments of the invention include measuring the k-space trajectory perturbations (due to hardware imperfections, spatially varying eddy current effects, and concomitant field effects) using external sensors to correct for baseline phase velocity errors by correcting for the k-space trajectory perturbation in each flow experiment prior to taking the phase difference or complex difference between two images with different velocity encoding values. Further embodiments of the invention allow elimination of effects of concomitant gradient fields without having to pre-calculate the spatially-varying phase and subtracting the subsequent pre-calculated phase error from the phase difference images. Further, such elimination is more accurate than pre-calculation using the knowledge of the gradient waveform amplitudes in the velocity encoding gradients.

A technical contribution for the disclosed method and apparatus is that it provides for a computer implemented system and method for correcting flow velocity measurements in phase contrast imaging using magnetic field monitoring. Embodiments of the invention may be programmed on a computer, an MRI system control, or on a computer readable storage medium for execution by a processor.

In accordance with another embodiment of the invention, an MRI apparatus includes a plurality of gradient coils positioned around a bore of a magnet and an RF coil assembly coupled to a pulse generator to emit RF pulse sequences and arranged to receive resulting MR signals from a subject of interest. A plurality of magnetic field monitoring devices positioned within the bore are included as well as a system control coupled to the plurality of gradient coils, the RF coil assembly, and the plurality of magnetic field monitoring devices. The system control is programmed to acquire a first set of data and a second set of data via the RF coil assembly during a scan and acquire a third set of data and a fourth set of data via the plurality of magnetic field monitoring devices during the scan. A first single data set from the first and third sets of data is formed, and a second single data set from the second and fourth sets of data is formed. The system control is also programmed to reconstruct a phase contrast image based on the first and second single data sets to correct for spatially-dependent background phase variations.

In accordance with another embodiment of the invention, a method of MR imaging includes exciting a plurality of spins in an imaging subject to emit a first signal, acquiring a first set of MR data from the first signal via an RF coil assembly, and acquiring a first set of magnetic field data via a plurality of magnetic field monitoring devices. The method also includes exciting a plurality of spins in an imaging subject to emit a second signal, acquiring a second set of MR data from the second signal via the RF coil assembly, and acquiring a second set of magnetic field data via the plurality of magnetic field monitoring devices. The first set of MR data is corrected for time-dependent main magnetic field offset using the first set of magnetic field data, and the second set of MR data is corrected for time-dependent main magnetic field offset using the second set of magnetic field data. Further, the method includes generating a phase contrast image based on the first and second corrected sets of MR data.

In accordance with another embodiment of the invention, the invention is embodied in a computer program stored on a computer readable storage medium and having instructions, which, when executed by a computer, cause the computer to execute a pair of scan sequences having a respective flow-encoding gradient applied therein and, during execution of each scan sequence, acquire an MR data set via an RF coil assembly, acquire a measured k-space location data set via a magnetic field monitoring system, and acquire a main magnetic field offset data set via the magnetic field monitoring system, the measured k-space location data set and the main magnetic field offset data set correlated to each other and to the MR data set. The instructions further cause the computer to correct k-space trajectory perturbations for each MR data set using the measured k-space location data set correlated thereto and using the first main magnetic field offset data set correlated thereto and reconstruct a phase contrast image based on the corrected MR data sets.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
a plurality of gradient coils positioned around a bore of a magnet;
an RF coil assembly coupled to a pulse generator to emit RF pulse sequences and arranged to receive resulting MR signals from a subject of interest;
a plurality of magnetic field monitoring devices positioned within the bore;
a system control coupled to the plurality of gradient coils, the RF coil assembly, and the plurality of magnetic field monitoring devices, wherein the system control is programmed to:
acquire a first set of data and a second set of data via the RF coil assembly during a scan;
acquire a third set of data and a fourth set of data via the plurality of magnetic field monitoring devices during the scan;
form a first single data set from the first and third sets of data;
form a second single data set from the second and fourth sets of data; and
reconstruct a phase contrast image based on the first and second single data sets to correct for spatially-dependent background phase variations.

2. The MRI apparatus of claim 1 wherein the system control, in being programmed to acquire the third and fourth sets of data, is programmed to acquire, for each of the third and fourth sets of data, a set of measured k-space locations for a respective velocity encoding gradient value and a set of main magnetic field offsets for the respective velocity encoding gradient value.

3. The MRI apparatus of claim 2 wherein the system control, in being programmed to form the first single data set, is programmed to:

merge k-space data in the first set of data with measured k-space locations of the set of measured k-space locations of the third set of data; and merge magnetic field offset data in the set of main magnetic field offsets of the third set of data with measured k-space locations of the set of measured k-space locations of the third set of data.

4. The MRI apparatus of claim 3 wherein the system control, in being programmed to form the first single data set, is further programmed to demodulate the merged k-space data of the third set of data with the merged magnetic field offset data of the third set of data to obtain a first magnetic field offset corrected k-space data set.

5. The MRI apparatus of claim 4 wherein the system control, in being programmed to form the second single data set, is programmed to:

merge k-space data in the second set of data with measured k-space locations of the set of measured k-space locations of the fourth set of data;

merge magnetic field offset data in the set of main magnetic field offsets of the fourth set of data with measured k-space locations of the set of measured k-space locations of the fourth set of data; and demodulate the merged k-space data of the fourth set of data with the merged magnetic field offset data of the fourth set of data to obtain a second magnetic field offset corrected k-space data set.

6. The MRI apparatus of claim 5 wherein the system control, in being programmed to reconstruct the phase contrast image, is programmed to:

perform one of a regridding technique and an image reconstruction technique to transform each of the first and second magnetic field offset corrected k-space data sets; and perform phase contrast imaging using the first and second magnetic field offset corrected k-space data sets and using one of a phase-difference reconstruction algorithm and a complex-difference algorithm.

7. The MRI apparatus of claim 2 wherein the velocity encoding gradient value is a polarity scheme; and wherein the system control is further programmed to:

cause the plurality of gradient coils to emit a pulse sequence having a first polarity scheme prior to the acquisition of the first set of data; and cause the plurality of gradient coils to emit a pulse sequence having a second polarity scheme prior to the acquisition of the second set of data, wherein the second polarity scheme is opposite the first polarity scheme.

8. The MRI apparatus of claim 1 wherein the system control is further programmed to acquire the first and third sets of data simultaneously, and wherein the system control is further programmed to acquire the second and fourth sets of data simultaneously.

9. The MRI apparatus of claim 1 wherein the system control, in being programmed to acquire the first and second sets of data, is programmed to acquire at least a portion of each of the first and second sets of data during an initial preparation phase of the scan; and wherein the system control, in being programmed to acquire the third and fourth sets of data, is programmed to acquire at least a portion of each of the third and fourth sets of data during the initial preparation phase of the scan.

10. A method of MR imaging comprising:

exciting a plurality of spins in an imaging subject to emit a first signal;

acquiring a first set of MR data from the first signal via an RF coil assembly;

acquiring a first set of magnetic field data via a plurality of magnetic field monitoring devices;

exciting a plurality of spins in an imaging subject to emit a second signal;

acquiring a second set of MR data from the second signal via the RF coil assembly;

acquiring a second set of magnetic field data via the plurality of magnetic field monitoring devices;

correcting the first set of MR data for time-dependent main magnetic field offset using the first set of magnetic field data;

correcting the second set of MR data for time-dependent main magnetic field offset using the second set of magnetic field data; and generating a phase contrast image based on the first and second corrected sets of MR data.

11. The method of claim 10 further comprising positioning the plurality of magnetic field monitoring devices around the imaging subject.

12. The method of claim 11 wherein the plurality of magnetic field monitoring devices comprises four magnetic field monitoring devices.

13. The method of claim 10 wherein acquiring the first set of magnetic field data comprises acquiring a set of measured k-space locations for a first velocity encoding gradient value and acquiring a set of main magnetic field offsets for the first velocity encoding gradient value; and wherein acquiring the second set of magnetic field data comprises acquiring a set of measured k-space locations for a second velocity encoding gradient value and acquiring a set of main magnetic field offsets for the second velocity encoding gradient value.

14. The method of claim 13 wherein the first velocity encoding gradient value is different than the second velocity encoding gradient value.

15. The method of claim 13 wherein correcting the first set of MR data comprises combining the first set of MR data, the set of measured k-space locations for the first velocity encoding gradient value, and the set of main magnetic field offsets for the first velocity encoding gradient value into a first corrected set of k-space data; and wherein correcting the second set of MR data comprises combining the second set of MR data, the set of measured k-space locations for the second velocity encoding gradient value, and the set of main magnetic field offsets for the second velocity encoding gradient value into a second corrected set of k-space data.

16. The method of claim 15 wherein generating the phase contrast image comprises:

resampling the first corrected set of k-space data onto a uniform rectilinear grid; and reconstructing the phase contrast image using the resampled first corrected set of k-space data and using one of a phase-difference reconstruction algorithm and a complex-difference algorithm.

17. The method of claim 15 wherein generating the phase contrast image comprises:

generate a respective image for each of the first and second corrected sets of k-space; and reconstructing the phase contrast image using the generated images and using one of a phase-difference reconstruction algorithm and a complex-difference algorithm.

18. The method of claim 10 wherein acquiring the first and the second sets of MR data comprises acquiring at least a portion of the first and second sets of MR data during an initial preparation phase of a scan sequence; and wherein acquiring the first and the second sets of magnetic field data comprises acquiring at least a portion of the first and second sets of magnetic field data during the initial preparation phase of the scan sequence.

19. A computer readable non-transitory storage medium having stored thereon a computer program comprising instructions, which, when executed by a computer, cause the computer to:

execute a pair of scan sequences having a respective flow-encoding gradient applied therein;

during execution of each scan sequence:
  acquire an MR data set via an RF coil assembly;
  acquire a measured k-space location data set via a magnetic field monitoring system;
  acquire a main magnetic field offset data set via the magnetic field monitoring system, the measured k-space location data set and the main magnetic field offset data set correlated to each other and to the MR data set;

correct k-space trajectory perturbations for each MR data set using the measured k-space location data set correlated thereto and using the first main magnetic field offset data set correlated thereto; and reconstruct a phase contrast image based on the corrected MR data sets.

20. The computer readable non-transitory storage medium of claim 19 wherein the instructions that cause the computer to correct k-space trajectory perturbations for each MR data set cause the computer to:

merge k-space data in each MR data set with measured k-space locations of the measured k-space location data set correlated thereto;

merge magnetic field offset data in each main magnetic field offset data set with measured k-space locations of the measured k-space location data set correlated thereto; and demodulate the merged k-space data of each MR data set with the merged magnetic field offset data of the main magnetic field offset data set correlated thereto.

21. The computer readable non-transitory storage medium of claim 19 wherein the instructions that cause the computer to reconstruct the phase contrast image cause the computer to:

perform one of a regridding technique and an image reconstruction technique to transform each corrected MR data set; and perform phase contrast imaging using each corrected MR data set and using one of a phase-difference reconstruction algorithm and a complex-difference algorithm.

* * * * *

UNITED STATES PATENT AND TRADEMARK OFFICE
CERTIFICATE OF CORRECTION

PATENT NO.       : 7,847,545 B2
APPLICATION NO.  : 12/101279
DATED            : December 7, 2010
INVENTOR(S)      : Wiesinger et al.

It is certified that error appears in the above-identified patent and that said Letters Patent is hereby corrected as shown below:

In Column 5, Line 63, in Eqn. 3, delete "$S_2(t) = -f(\vec{r})$" and insert -- $S_2(t) = ff(\vec{r})$ --, therefor.

In Column 6, Line 16, delete "v." and insert -- $v$. --, therefor.

In Column 6, Line 21, delete "$\phi_e(\vec{r}))$" and insert -- $\phi_e(\vec{r})$ --, therefor.

In Column 13, Line 1, in Claim 18, delete "thefirst" and insert -- the first --, therefor.

Signed and Sealed this
Nineteenth Day of April, 2011

David J. Kappos
*Director of the United States Patent and Trademark Office*